(12) United States Patent
Roehrer

(10) Patent No.: US 8,836,026 B2
(45) Date of Patent: Sep. 16, 2014

(54) HIGH-VOLTAGE TRANSISTOR HAVING MULTIPLE DIELECTRICS AND PRODUCTION METHOD

(75) Inventor: Georg Roehrer, Lebring (AT)

(73) Assignee: AMS AG, Unterpremstätten (AT)

( * ) Notice: Subject to any disclaimer, the term of this patent is extended or adjusted under 35 U.S.C. 154(b) by 80 days.

(21) Appl. No.: 13/505,970

(22) PCT Filed: Oct. 20, 2010

(86) PCT No.: PCT/EP2010/065809
§ 371 (c)(1),
(2), (4) Date: Jul. 20, 2012

(87) PCT Pub. No.: WO2011/054670
PCT Pub. Date: May 12, 2011

(65) Prior Publication Data
US 2012/0280319 A1   Nov. 8, 2012

(30) Foreign Application Priority Data

Nov. 3, 2009  (DE) .......................... 10 2009 051 745

(51) Int. Cl.
| | | |
|---|---|---|
| H01L 29/78 | (2006.01) | |
| H01L 21/336 | (2006.01) | |
| H01L 29/06 | (2006.01) | |
| H01L 29/423 | (2006.01) | |
| H01L 29/66 | (2006.01) | |
| H01L 29/40 | (2006.01) | |

(52) U.S. Cl.
CPC ........ *H01L 29/7816* (2013.01); *H01L 29/0653* (2013.01); *H01L 29/42368* (2013.01); *H01L 29/66681* (2013.01); *H01L 29/402* (2013.01)

USPC ............ 257/337; 257/E29.256; 257/E21.417; 438/286

(58) Field of Classification Search
USPC ............ 438/286; 257/337, E29.256, E21.417
See application file for complete search history.

(56) References Cited

U.S. PATENT DOCUMENTS

| | | |
|---|---|---|
| 4,922,327 A | 5/1990 | Mena et al. |
| 5,517,046 A | 5/1996 | Hsing et al. |

(Continued)

FOREIGN PATENT DOCUMENTS

| | | |
|---|---|---|
| DE | 102 10 662 | 9/2002 |
| DE | 10 2004 049 246 | 4/2006 |
| EP | 0 069 429 | 1/1983 |

OTHER PUBLICATIONS

Efland, T.R. et al.: Lateral Thinking About Power Devices (LDMOS), Texas Instruments Inc., Dallas, Texas, USA, IEDM 98, pp. 679-682.

*Primary Examiner* — Matthew W Such
*Assistant Examiner* — Monica D Harrison
(74) *Attorney, Agent, or Firm* — McDermott Will & Emery LLP

(57) ABSTRACT

On a doped well (2) for a drift section, at least two additional dielectric regions (7,9) having different thicknesses are present between a first contact region (4) for a drain and a second contact region (5) for source on the upper face (10) of the substrate (1), and the gate electrode (11) or an electric conductor, which is electrically conductively connected to the gate electrode, covers each of said additional dielectric regions at least partially.

4 Claims, 1 Drawing Sheet

(56) References Cited

U.S. PATENT DOCUMENTS

| | | |
|---|---|---|
| 5,548,150 A | 8/1996 | Omura et al. |
| 6,168,983 B1 | 1/2001 | Rumennik et al. |
| 6,509,220 B2 | 1/2003 | Disney |
| 6,620,688 B2 * | 9/2003 | Woo et al. ............ 438/262 |
| 2002/0079509 A1 | 6/2002 | Efland et al. |
| 2003/0100165 A1 | 5/2003 | Pearce et al. |
| 2008/0164516 A1 | 7/2008 | Darwish |
| 2009/0114987 A1 * | 5/2009 | Tanaka ............ 257/335 |
| 2009/0140343 A1 * | 6/2009 | Feilchenfeld et al. ........ 257/367 |

* cited by examiner

HIGH-VOLTAGE TRANSISTOR HAVING MULTIPLE DIELECTRICS AND PRODUCTION METHOD

RELATED APPLICATIONS

This application is a U.S. National Phase Application under 35 USC 371 of International Application PCT/EP2010/065809 filed Oct. 20, 2010.

This application claims the priority of Germany application no. 10 2009 051 745.6 filed Nov. 3, 2009, the entire content of which is hereby incorporated by reference.

FIELD OF THE INVENTION

The present invention relates to a high-voltage transistor with dielectric regions of differing thicknesses in the region of the gate and the drift section.

BACKGROUND OF THE INVENTION

A high-voltage transistor comprises a channel region between source and drain that is controlled by a gate electrode separated from the semiconductor material by the gate dielectric. A drift section is provided between the channel region and the drain. Above the drift section, an isolation region can be provided, which can be a field oxide in particular, or a shallow trench isolator that is formed from an oxide of the semiconductor material. A field plate, connected to the gate electrode and used for influencing the electric field in the drift section, can be arranged on top of this isolation region.

The publication by T. R. Efland et al.: "Lateral Thinking About Power Devices (LDMOS)" in IEDM 98, pp. 679-682, 1998, describes an LDMOS transistor in which the gate oxide has different thicknesses in certain areas, so that a step is present in the gate oxide above the channel region. The thicker portion of the gate oxide is situated partially above the channel region and partially above a region of an n-type well present between the channel region and a high-doped n-type region of the drain. The operating properties of this transistor are also described in this publication.

SUMMARY OF THE INVENTION

An object of the present invention is to specify a novel high-voltage transistor, in particular a transistor with a breakdown voltage greater than 20 V, and an associated production method.

This and other objects are attained in accordance with one aspect of the invention directed to a high-voltage transistor having several doped wells on the upper side of a substrate made of semiconductor material. The wells comprise at least a first well provided for a drift section, in which well a first contact area for a drain terminal is present, and a well provided for a channel region, in which well a second contact area is provided for a source terminal. A gate dielectric is located on a region of the second well between the first contact area and the second contact area, and a gate electrode is arranged on the gate dielectric. At least two additional dielectric regions, whose thicknesses are different from one another and from the thickness of the gate dielectric, are present on the upper side of the substrate on the first well between the first contact area and the second contact area. The gate electrode or an electrical conductor electroconductively connected to the gate electrode covers each of these additional dielectric regions at least partially.

In an embodiment of the high-voltage transistor, the gate dielectric and the additional dielectric regions transition into one another and form a step at each transition point.

In another embodiment, the gate dielectric and the additional dielectric regions comprise oxide layers that are arranged on the upper side of the substrate.

Another embodiment has a dielectric region that is arranged on the drain side and is formed by a field oxide or shallow trench isolator.

In another embodiment, at least one of the dielectric regions is a capacitor dielectric, and an electrical conductor made of polysilicon that is electroconductively connected to the gate electrode is arranged on the capacitor dielectric.

In another embodiment, the gate dielectric is also present on a region of the first well.

In the production method, a first well of a first conductivity type and a second well of a second conductivity type opposite to the first type are formed on an upper side of a substrate made of semiconductor material. A first contact region is formed in the first well, and a second one in the second well. A gate dielectric is produced on a region of the second well between the first contact area and the second contact area. At least two additional dielectric regions, whose thicknesses are different from one another and from the thickness of the gate dielectric, are produced on the upper side of the substrate on the first well between the first contact area and the second contact area.

In one configuration of the method, a gate electrode is applied to the gate dielectric in such a manner that the gate electrode at least partially covers each of the additional dielectric regions.

In another configuration, a gate electrode made of polysilicon is applied to the gate dielectric, an electrical conductor made of polysilicon is applied to one of the additional dielectric regions, and the electrical conductor is electroconductively connected to the gate electrode.

In another configuration of the method, at least one of the additional dielectric regions is applied as an oxide layer to the upper side of the substrate, and one of the additional dielectric regions is produced as a field oxide or as a shallow trench isolator.

DETAILED DESCRIPTION OF THE DRAWINGS

Figure 1:
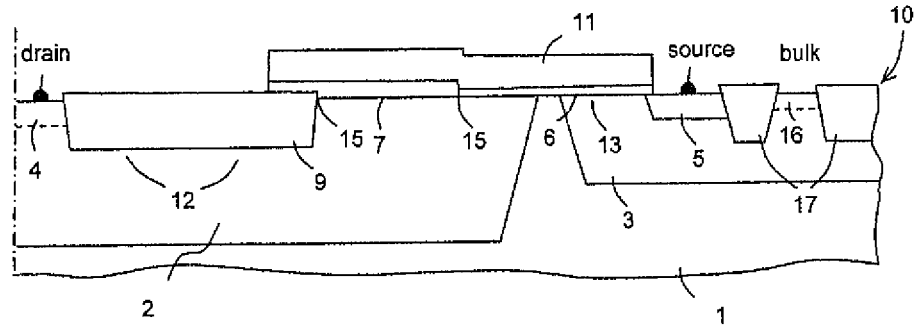
FIG. 1 shows a first embodiment of the high-voltage transistor in cross section.

FIG. 1 shows an embodiment of the high-voltage transistor in cross section. On an upper side 10 of a semiconductor material substrate 1, there is a first well 2 of a first conductivity type and a second well 3 of an opposite, second conductivity type. A first contact area 4 for a drain terminal, highly doped with the conductivity type of the first well 2, is formed at the upper side 10 in the first well 2. A second contact area 5 for a source terminal, highly doped oppositely to the conductivity type of the second well 3, is formed at the upper side 10 in the second well 3. A third contact area 16, highly doped for the conductivity type of the second well 3, can be provided for a bulk terminal of the third well 3. The upper-side doped regions can be separated by isolation regions 17, in particular field oxide or shallow trench isolators made from an oxide of the semiconductor material, for example.

The first well 2 contains a region that is provided for a drift section 12. The second well 3 contains a region that is provided for a channel region 13. The drift section 12 and the channel region 13 are located between the first contact area 4 and the second content area 5. A gate dielectric 6, which can be an oxide of the semiconductor material for example, is situated above the channel region 13. A gate electrode 11 that is provided for controlling the channel region is arranged on the gate dielectric G. At least two additional dielectric regions 7, 9 are present, whose thicknesses differ from one another and from the thickness of the gate dielectric 6. The additional dielectric regions 7, 9 transition into one another and form a step at each of the transition points 15. The gate electrode 11 covers the gate dielectric 6 and each of the additional dielectric regions 7, 9 at least partially.

The dielectric region 7 adjoining the gate dielectric 6 is formed in the embodiment of FIG. 1 by an upper-side dielectric layer that can be an oxide of the semiconductor material, for example, like the gate dielectric. The gate dielectric 6 and the adjoining oxide layer 7 have different thicknesses, so that a step is formed at the transition point 15 between the gate dielectric 6 and the oxide layer 7. An additional dielectric region 9, which adjoins on the drain side, is formed in this embodiment by a field oxide or a shallow trench isolator (STI). The gate electrodes 11 can partially cover the field oxide or the shallow trench isolator 9. That is represented as an example in the cross section of FIG. 1. Alternatively, the gate electrode 11 can be present up to the drain terminal on the entire field oxide or the entire shallow trench isolator. It is advantageous if the gate electrode 11 covers the drift section 12 at least partially as a field plate.

In comparison to conventional high-voltage transistors, the embodiment according to FIG. 1 offers a lower resistance in the on state and a relatively high breakdown voltage. To produce this embodiment, a conventional isolation region can be provided from a field oxide or a shallow trench isolator 9 on the drain side, and an additional oxide layer 7 that is thicker than the gate dielectric 6 can be applied between this isolation region and the gate dielectric 6. In particular, the production is accordingly possible in a dual gate oxide process without substantial additional expense.

Figure 2:
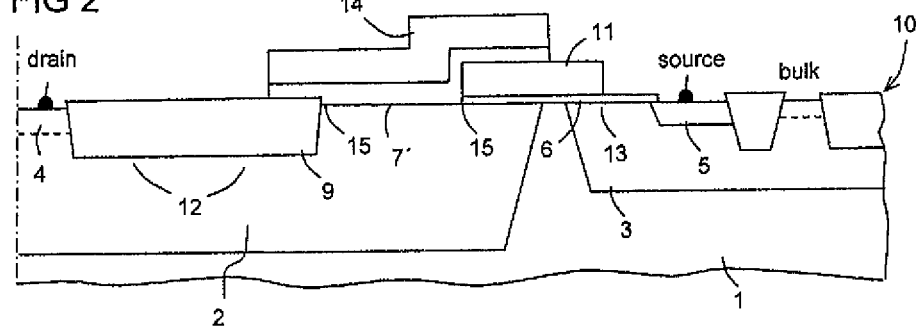
FIG. 2 shows a further embodiment, in which an additional dielectric region is formed from a capacitor dielectric.

FIG. 2 shows a cross section through another embodiment of the high-voltage transistor, in which a capacitor dielectric 7' is present as an additional dielectric region between the gate dielectric 6 and a field oxide or a shallow trench isolator 9 on the upper side 10 of the substrate 1. A capacitor dielectric is used in a process in which capacitors are produced on the upper side of the component. For this purpose, electrically conductive layers, polysilicon layers in particular, can be applied to the substrate as capacitor plates (not shown). The capacitor dielectric is arranged between the capacitor plates.

In the embodiment of the high-voltage transistor according to FIG. 2, the material provided for the upper capacitor electrode, polysilicon in particular, can also be used to form an electrical conductor 14 over the dielectric regions. The electrical conductor 14 is preferably electroconductively connected to the gate electrode 11. The electrical connection provided for this purpose is situated in the embodiment of FIG. 2 in front of or behind the drawing plane and is therefore not recognizable in the cross section.

In the embodiment according to FIG. 2 as well, steps are formed at each of the transition points 15 between the dielectric regions. The capacitor dielectric 7' has a markedly greater thickness than the gate dielectric 6. According to FIG. 2, the electrical conductor 14 can cover the field oxide or shallow trench isolator 9 only partially, or alternatively can completely cover the field oxide or the shallow trench isolator 9. It is advantageous if the electrical conductor 14 covers the drift section 12 at least partially as a field plate. The other elements drawn in FIG. 2 correspond to those with the same reference numbers in FIG. 1.

Figure 3:
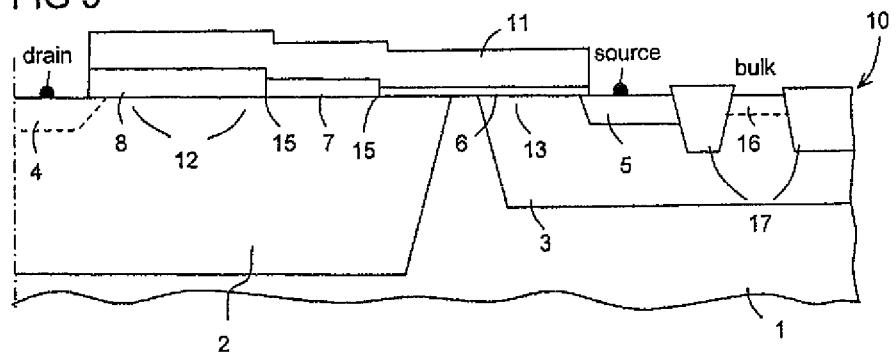
FIG. 3 shows a further embodiment, in which three dielectric layers of different thicknesses are present on the upper side.

FIG. 3 shows in cross section a further embodiment, in which the dielectric regions 7, 8 are present as dielectric layers of different thicknesses on the upper side 10 of the substrate 1. A field oxide or a shallow trench isolator as in the embodiments of FIGS. 1 and 2 is omitted in the embodiment according to FIG. 3. Both the gate dielectric 6 and the additional dielectric regions 7, 8 can be an oxide of the semiconductor material, for example. The thicknesses of these layers are respectively different, so that steps are likewise formed at each of the transition points 15 between the dielectric layers in the embodiment according FIG. 3. The gate electrode 11 in the example of FIG. 3 completely covers the gate dielectric 6 and the additional dielectric regions 7, 8. In another embodiment, the gate electrode 11 only partially covers the dielectric regions. It is advantageous if the gate electrode 11 covers the drift section 12 at least partially as a field plate.

Figure 4:
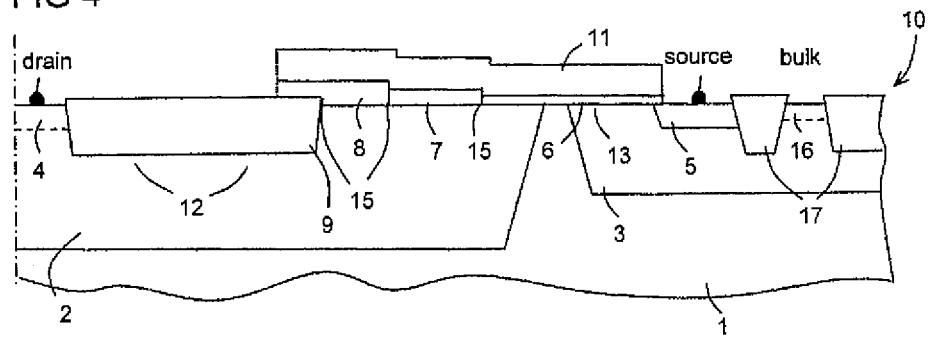
FIG. 4 shows a further embodiment, in which an isolation region made of a field oxide or a shallow trench isolator is present in addition to the dielectric layers according to FIG. 3.

In contrast to the embodiment according to FIG. 3, a field oxide or shallow trench isolator 9 is additionally present on the drain side in the embodiment of FIG. 4. The embodiment according to FIG. 4 thus has three steps at the transition points 15.

The number of additional dielectric regions of different thicknesses is not limited to the number in the described embodiments, but can instead be chosen according to the respective requirements. In this manner, the operating properties of the high-voltage transistor can be matched to the respective requirements. In particular, the portion of the gate electrode functioning as a field plate can thereby be arranged a particularly favorable distance away from the drift section. The capacitance between the gate electrode or field plate and the semiconductor material can be adjusted variably in spatial terms in order to optimize the operating properties, especially those between the channel region and the drain contact region.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. A high-voltage transistor comprising:
   a substrate made of semiconductor material with an upper side,
   doped wells at the upper side, which comprise at least a first well provided for a drift section and a second well provided for a channel region;
   a first contact area for a drain terminal in the first well;
   a second contact area for a source terminal in the second well;
   a gate dielectric on a region of the second well between the first contact area and the second contact area, a gate electrode on the gate dielectric; and
   at least two additional dielectric regions, each of whose thicknesses is different from one another and from a thickness of the gate dielectric, the at least two additional dielectric regions being disposed on the upper side on the first well between the first contact area and the second contact area, wherein at least one of the at least two dielectric regions is a capacitor dielectric, and wherein an electrical conductor made of polysilicon and electroconductively connected to the gate electrode is arranged on the capacitor dielectric.

2. A high-voltage transistor comprising:

a substrate made of semiconductor material with an upper side, doped wells at the upper side, which comprise at least a first well provided for a drift section and a second well provided for a channel region;

a first contact area for a drain terminal in the first well;

a second contact area for a source terminal in the second well;

a gate dielectric on a region of the second well between the first contact area and the second contact area, a gate electrode on the gate dielectric; and at least two additional dielectric regions, each of whose thicknesses is different from one another and from a thickness of the gate dielectric, the at least two additional dielectric regions being disposed on the upper side on the first well between the first contact area and the second contact area, wherein the gate electrode completely covers the gate dielectric and at least two of the at least two additional dielectric regions, and wherein the gate dielectric is disposed on a region of the first well.

3. A method for producing a high-voltage transistor, comprising:

producing a first well of a first conductivity type and a second well of an opposite, second conductivity type on an upper side of a substrate made of semiconductor material;

producing a first contact area in the first well and a second contact area in the second wells;

producing a gate dielectric on a region of the second well between the first contact area and the second contact area; and producing at least two additional dielectric regions, each of whose thicknesses is different from one another and from the thickness of the gate dielectric, such that the at least two additional dielectric regions are disposed on the upper side on the first well between the first contact area and the second contact area, wherein a gate electrode made of polysilicon is applied to the gate dielectric, wherein an electric conductor is applied to one of the additional dielectric regions, and wherein the electrical conductor is electroconductively connected to the gate electrode.

4. The method according to claim 3, wherein at least one of the at least two additional dielectric regions is applied as an oxide layer to the upper side, and wherein one of the at least two additional dielectric regions is produced as a field oxide or shallow trench isolator.

* * * * *